(12) United States Patent
Hynecek

(10) Patent No.: US 8,723,284 B1
(45) Date of Patent: May 13, 2014

(54) BACK SIDE ILLUMINATED CMOS IMAGE SENSOR WITH GLOBAL SHUTTER STORAGE GATES STACKED ON TOP OF PINNED PHOTODIODES

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 320 days.

(21) Appl. No.: 13/065,039

(22) Filed: Mar. 11, 2011

Related U.S. Application Data

(60) Provisional application No. 61/438,785, filed on Feb. 2, 2011.

(51) Int. Cl.
*H01L 21/00* (2006.01)
(52) U.S. Cl.
USPC ........... 257/447; 257/228; 257/292; 257/460; 257/E31.39
(58) Field of Classification Search
USPC .................................. 257/447, E31.039, 292
See application file for complete search history.

(56) References Cited

U.S. PATENT DOCUMENTS

| 5,625,210 A | 4/1997 | Lee et al. | |
|---|---|---|---|
| 2006/0001059 A1* | 1/2006 | Mouli et al. | 257/292 |
| 2006/0125038 A1* | 6/2006 | Mabuchi | 257/447 |

OTHER PUBLICATIONS

Yasutomi et al., "A 2.7e Temporal Noise 99.7% Shutter Efficiency 92dB Dynamic Range CMOS Image Sensor with Dual Global Shutter Pixels", 2010 (3 pages) ISSCC 2010/Session 22/Image Sensors/ 22.3.

* cited by examiner

*Primary Examiner* — Hsin-Yi Hsieh
(74) *Attorney, Agent, or Firm* — David C. Kellogg

(57) ABSTRACT

The invention describes a solid-state CMOS image sensor array and in particular describes in detail the image sensor array pixels, with global and rolling shutter capabilities, that utilize charge storage gates located on top of a pinned photodiode. The sensor array is illuminated from the back side and the location of the storage gate on top of the pinned photodiode saves valuable pixel area, which does not compromise the Dynamic Range of the image sensor.

20 Claims, 2 Drawing Sheets

BACK SIDE ILLUMINATED CMOS IMAGE SENSOR WITH GLOBAL SHUTTER STORAGE GATES STACKED ON TOP OF PINNED PHOTODIODES

CROSS REFERENCE TO RELATED APPLICATION

This application claims priority under 35 USC Sec. 119 (e)(1) of provisional application No. 61/438,785 filed on Feb. 2, 2011.

BACKGROUND OF THE INVENTION

1. Field of the Invention

The present invention relates to back side illuminated solid-state image sensors, and more particularly to small pixel size, back side illuminated CMOS image sensors having both global shutter (GS) and rolling shutter (RS) capabilities.

2. Discussion of Related Art

Typical image sensors sense light by converting impinging photons into electrons that are integrated (collected) in sensor pixels. After completion of an integration cycle collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog pixel voltage signal can also be converted on-chip to a digital equivalent before reaching the chip output. The pixels have incorporated in them a buffer amplifier, typically a Source Follower (SF), which drives the sense lines that are connected to the pixels by suitable addressing transistors. After charge to voltage conversion is completed and the resulting signal transferred out from the pixels, the pixels are reset in order to be ready for accumulation of new charge. In pixels that are using Floating Diffusion (FD) as the charge detection node, the reset is accomplished by momentarily turning on a reset transistor that conductively connects the FD node to a voltage reference, which is typically the pixel drain node. This step removes collected charge; however, it generates kTC-reset noise as is well known in the art. kTC noise has to be removed from the signal by the Correlated Double Sampling (CDS) signal processing technique in order to achieve the desired low noise performance. The typical CMOS sensors that utilize the CDS concept usually require four transistors (4T) in the pixel. An example of the 4T pixel circuit with pinned photodiode can be found in the U.S. Pat. No. 5,625,210 to Lee, which patent is herein incorporated by reference.

The principal disadvantage of standard CMOS sensors is that the pixel scanning, after charge has been accumulated in them, is performed in a sequential manner row by row. This generates an exposure time skew, which can be observed in the pictures of moving objects and which causes an undesirable picture distortion. This method of CMOS sensor scanning is called the "rolling shutter" mode and it resembles the action of the focal plane slit shutter in the old photographic film cameras. In most applications, however, it is preferable to expose all the pixels of the image at the same time without the skew and thus eliminate the distortion of moving objects. This type of sensor operation is called the "global shuttering" mode, which resembles the operation of a mechanical iris shutter in film cameras. In order to implement this kind of global shuttering it is necessary to provide another charge storage site in the pixels. After charge is integrated in the photodiodes of the pixels it is transferred to the pixel storage sites simultaneously in all the pixels of the array where it can wait for the scanning in the row by row fashion. The pixel scanning time skew is thus independent of the frame pixel exposure time. There have been several methods published in the literature of how to incorporate an additional charge storage site into the CMOS sensor pixels. A recent publication described in: ISSCC Digest of Technical Papers pp. 398, 399, by Keita Yasutomi, Shinya Itoh, Shoji Kawahito entitled: "A 2.7e Temporal Noise 99.7% Shutter Efficiency 92 dB Dynamic Range CMOS Image Sensor with Dual Global Shutter Pixels", is a modification of the well known Interline Transfer CCD concept where charge from the pixel photodiodes is transferred first into vertical CCD registers located in the spaces between the pixels and then from there transferred in parallel fashion row by row into the serial register followed by the CCD transfer out into the common single amplifier. The application of the CCD charge transfer concept into the CMOS image sensor, to implement the global shuttering mode is shown in FIG. 1.

FIG. 1 represents a simplified circuit diagram of the prior art pixel 100 of a CMOS sensor that has the global shuttering capability. After charge integration is completed in the pinned photodiode 101 charge is transferred via the transfer gate transistor 103 into the second pinned photodiode 102 where it waits for scanning. The charge transfer from the first to the second pinned photodiode is completed in a CCD fashion without generating kTC noise. It is also necessary that the second pinned photodiode 102 have a higher pinning voltage than the first pinned photodiode 101 or the transfer gate 103 have a potential barrier and a well incorporated in it. Moreover it is necessary that the charge storage in the second pinned photodiode 102 be well shielded from impinging photons 115 to prevent undesirable smear effects when the objects in the scene move. The signal charge readout from the second pinned photodiode 102 then proceeds in the standard way by first resetting the Floating Diffusion (FD) node 104 to the drain bias voltage by momentarily turning on the reset transistor 106 followed by pulsing the gate of charge transfer transistor 105. This sequence can now proceed in a sequential order row by row. The signal appearing on the FD node 104 is buffered by the source follower transistor 107 which is addressed by a row addressing transistor 108. The signals to the charge transfer transistor gate, reset transistor, and the addressing transistor are supplied by the row buss lines 111, 112, 113 and 114 respectively. The Vdd bias is supplied to the pixels by the column Vdd line 109 and the signal output appears on the column output line 110. Using pinned photodiodes for charge storage is advantageous since it is well known that these photodiodes have a low dark current generation. High dark current in the storage sites would add to noise and also would generate undesirable shading effects in the picture that would have to be compensated for. Unfortunately, the second pinned photodiode 102 consumes a significant amount of valuable pixel area, thus increasing the size of the sensor and ultimately its cost. It is therefore desirable to investigate other possibilities of how to build CMOS sensors with the global shuttering capability that consume less pixel area but at the same time do not sacrifice pixel performance.

SUMMARY OF THE INVENTION

The present invention overcomes the shortcomings of the prior art by utilizing the charge storage region below the charge storage gate located on top of a pinned photodiode for collection of photo-generated electrons. This has the advantage that when a pixel is illuminated from the back side the storage gate region that collects photo-generated electrons can be made very narrow. This provides for adequate storage gate shielding thus preventing smearing artifacts.

The advantage of using the top storage gate structure for the sensors that require the global shuttering capability is that minimum pixel size is not sacrificed or traded off for the charge storage capability and that the rest of the pixel circuits and the method of pixel operation including the pixel performance is the same as in the standard 4T configuration. It is a further object of the disclosed invention to provide a practical CMOS image sensor pixel design using the storage gate located on top of the pinned photodiode that can be used to implement the global shuttering capability in high performance back side illuminated CMOS image sensor arrays, wherein the CMOS image sensor can then operate in both the rolling shutter and the global shutter modes.

Furthermore it is an object of the disclosed invention to provide the CMOS image sensor design by having several top charge storage sites per pixel by incorporating several top storage gates on top of a single pinned photodiode without a significant pixel area penalty. This provides additional flexibility to the sensor and increases the sensor dynamic range by permitting multiple sampling. The multiple storage gates for each pixel also provide a new image sensor functionality. For example sensors that incorporate such multiple storage gates on top of the pinned photodiode and thus can accumulate signal charge from one pixel for several different integration times, can be used for moving target detection by pixel level signal differencing.

BRIEF DESCRIPTION OF THE DRAWINGS

The invention will be described in detail in the following description of the preferred embodiments with reference to the following figures wherein.

DESCRIPTION OF THE PREFERRED EMBODIMENTS

Figure 1:
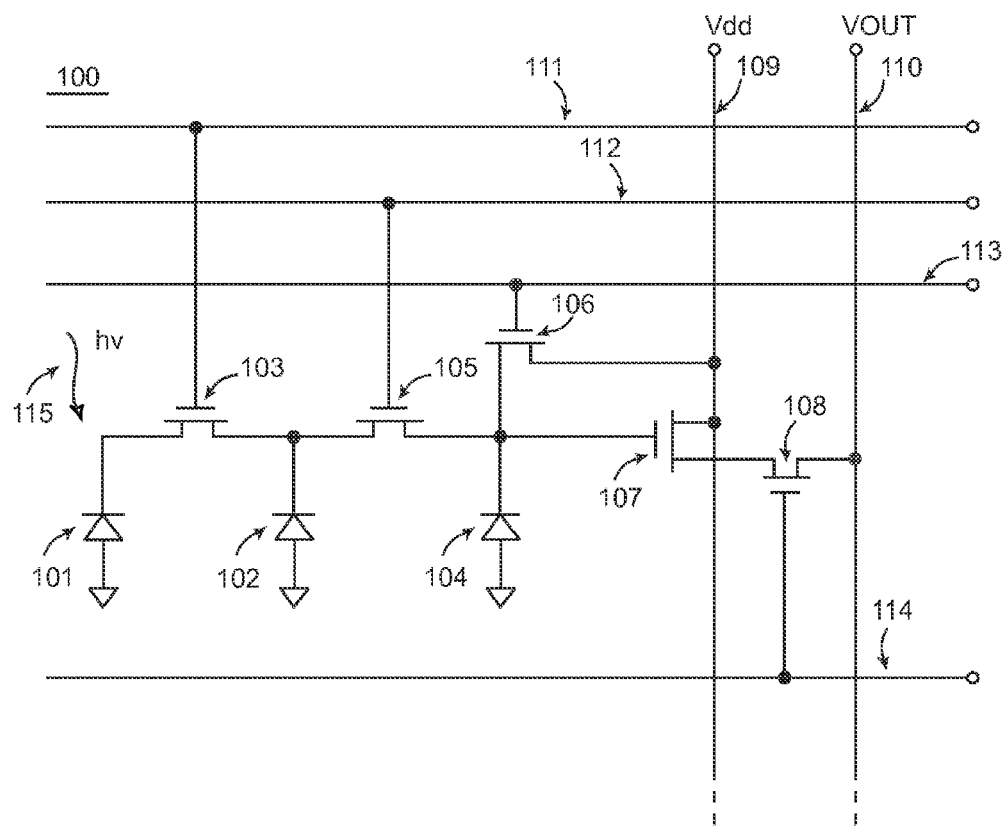
FIG. 1 shows the simplified schematic diagram of a prior art CMOS image sensor pixel that has the rolling shutter capability by using a second pinned diode for charge storing.
Figure 2:
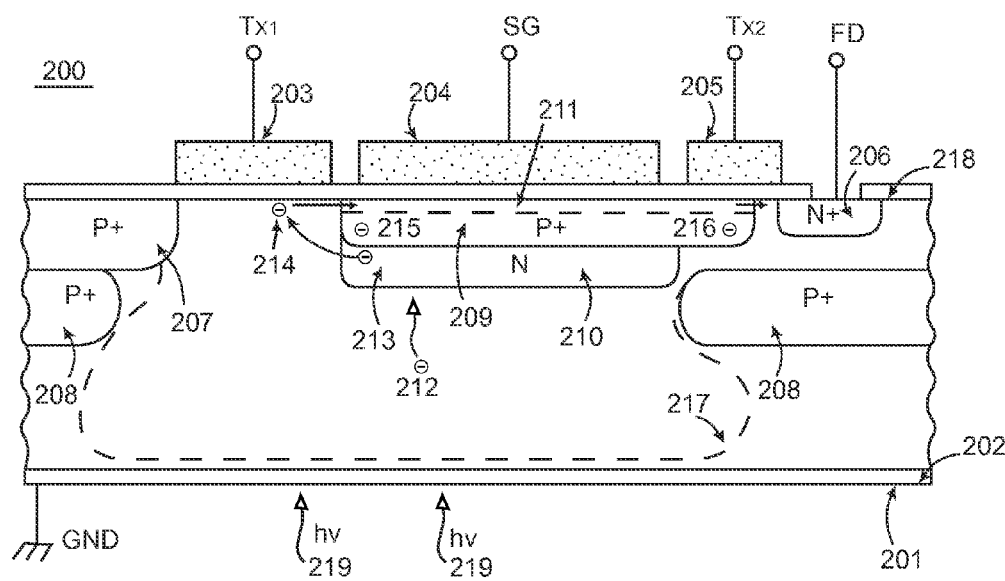
FIG. 2 shows the simplified cross section of the pixel of the present invention having transfer gates for charge transfer from the pinned photo diode to the region under the charge storage gate and from there to a floating diffusion node. The storage gate is located on top of the pinned photodiode. The pixel is illuminated from the back side.

The present invention will be described with reference to FIG. 2 which represents the simplified device cross section of a CMOS sensor pixel 200. The pixel 200 consists of a pinned photodiode with a top storage gate 204. The pinned photodiode is formed by the p+ type doped layer 209 and the n type doped layer 210. The substrate 201 is p type doped and has a p+ type doped layer 202 deposited near the back surface. This layer 202 helps suppress dark current generation in that area. The top surface of the structure has an insulating layer 218, preferably silicon dioxide, grown on it that serves as the gate insulator for poly-silicon gates 203, 204 and 205. Gate 203 is the transfer gate Tx1, which is used to transfer accumulated electron charge 213 from the pinned photodiode to an area under the gate 203 as charge 214, when this gate 203 is pulsed positive. After the gate bias returns to its original bias level, which is zero or slightly negative, electron charge 214 is then transferred to an area under gate 204 and is stored there as charge 215. The storage gate 204 is biased by a constant positive bias such as Vdd. The positive bias causes a channel or potential well 211 to form for storing electrons in the silicon near the silicon-silicon dioxide interface as shown in FIG. 2. The stored electrons travel at this silicon-silicon dioxide interface because it is the region of maximum potential within the potential well 211. This potential well 211 is approximately only 500 A thick, which is important to minimize the number of photon generated electrons in that area which would cause smearing effects. When a transfer gate 205, which is the output transfer gate Tx2, is pulsed positive, charge 215 from an area under the storage gate 204 is transferred under the gate 205 as charge 216 and further on to floating diffusion region 206 as the desired signal. For ease of illustration in FIG. 2 charge 215 and 216 is shown traversing p+ layer 209. In actuality this charge traverses a channel or potential well 211. Preferably the charge traverses the channel or potential well 211 at the silicon-silicon dioxide interface. The pixel 200 also includes a reset transistor, a source follower transistor, and an addressing transistor, which are connected in a known manner, and for simplicity are not shown in the drawing of FIG. 2. For example, the reset transistor is similarly connected as the transistor 106 in FIG. 1, the source follower transistor as transistor 107, and the addressing transistor as transistor 108. The source of the source follower transistor is connected through the addressing transistor to the pixel column bus line that receives the signal from the source follower transistor and transfers it to peripheral circuits for further processing. The pixel 200 also has additional p+ type doped layers 207 and 208 implanted therein that serve as pixel-to-pixel isolation and as a barrier for electrons thus preventing charge loss directly to the floating diffusion region 206 and to other pixel transistors not shown in the drawing. The photons 219 enter the device from the back side and generate electrons 212 in a depletion region 217. Electrons are then swept to the n type doped region 210 and are accumulated and stored therein during the integration time. Electrons that are generated outside of the depletion region 217 first diffuse to the edge boundary of depletion region 217 and thereafter are again swept into the pinned photodiode storage region 210. The back surface of the image sensor array can have various types of color filters, light shielding layers, and micro-lenses deposited on it to provide the color sensing capability.

During the global shutter mode of operation, after enough charge is accumulated in the pinned photodiode of each pixel, all Tx1 gates of the array are pulsed simultaneously and charge from all the pixels is transferred under the pixel storage gates 204. The signal readout from the charge storage gates 204 then proceeds in the sequential mode, row by row, as is typical in all CMOS image sensors. It is also possible to pulse the Tx1 gate sequentially and operate the sensor in the rolling shutter mode where the charge storage time in the storage gate 204 is minimized. This mode of operation may have an advantage when an extremely low dark current operation is required. The signal readout from the charge storage gate 204 uses the standard CDS operation where the floating diffusion node is first reset and sampled before charge is transferred on it and then sampled again. This procedure eliminates the kTC noise and minimizes the pixel-to-pixel non-uniformities as is well known in the art. The advantage of using the top storage gate structure for the CMOS image sensors that require the global shuttering capability is that a minimum pixel size is not sacrificed due to the novel placement of the charge storage gates directly above the pinned photodiodes. Also the remaining pixel circuitry and the method of pixel operation including pixel performance is the same as in the standard 4T configuration.

In another embodiment of the invention the pixel 200 has two or more Tx1 gates 203, two or more charge storage gates

204, and two or more output gates 205. This is not shown in the drawing. Multiple charge storage gates 204 connected to the same pinned photodiode allows for a quick sequential image sampling where the integration times are the same. This is important when it is desirable to detect moving targets, since only the pixels, having a change in accumulated charge during consecutive image sampling of the same integration time, produce a difference signal. Another advantage of using multiple storage gates is an increase in pixel dynamic range, since the integration time for the consecutive scene sampling can be different. The pixels 200 with a signal that has overflowed the well capacity can be sampled again with a shorter integration time and not be saturated.

There are many modifications possible to the disclosed invention and to the particular embodiments described by the above drawing. This is well known to those skilled in the art. However, the main points of this invention that are novel are the top storage gate located above the pinned photodiode and the multiple, top storage gates connected to the single pinned photodiode via multiple transfer gates.

The above described preferred embodiments of the novel pixel for the CMOS image sensor array with top storage gates are intended to be illustrative and not limiting. It is noted that persons skilled in the art can make modifications and variations in light of the above teachings. It is therefore to be understood that changes may be made in the particular embodiments of the invention disclosed, which are within the scope and spirit of the invention.

Having thus described the invention with the details and particularity required by the patent laws, what is claimed and desired protected by Letters Patent is set forth in the appended claims.

What is claimed is:

1. A back side illuminated CMOS image sensor array having at least one pixel circuit, each pixel circuit comprising:
   a charge storage gate;
   a charge storage region below the charge storage gate;
   a pinned photodiode, wherein the charge storage region is located on top of the pinned photodiode;
   a first transfer gate coupled between the pinned photodiode and the charge storage region, wherein the first transfer gate transfers charge from the pinned photodiode to the charge storage region; and
   an output transfer gate coupled between said charge storage region and a charge detection means.

2. The CMOS image sensor array of claim 1 wherein said charge storage region beneath the charge storage gate comprises a silicon-silicon dioxide interface.

3. The CMOS image sensor array of claim 1 wherein said charge detection means includes a floating diffusion region and wherein the output transfer gate is coupled between the charge storage region and the floating diffusion region and transfers charge from the charge storage region to the floating diffusion region.

4. The CMOS image sensor array of claim 3 wherein each pixel circuit further includes a source follower transistor having a gate connected to said floating diffusion region; a reset transistor connected to said floating diffusion region and a reset reference voltage; and an addressing transistor connected to said source follower and array column bus lines whereby a signal from said source follower transistor is transferred to peripheral circuitry for further processing.

5. The CMOS image sensor array of claim 3 wherein, after accumulating sufficient charge in the pinned photodiodes, all the corresponding first transfer gates are pulsed simultaneously whereby said charge is transferred under said charge storage gates simultaneously and subsequently read out in a sequential manner row by row thus providing a global shutter mode of operation.

6. The CMOS image sensor array of claim 3 wherein after accumulating sufficient charge in the pinned photodiodes, said corresponding first transfer gates are pulsed sequentially whereby said charge is transferred under said charge storage gates sequentially and subsequently read out in a sequential manner row by row thus providing a rolling shutter mode of operation whereby charge storage time in said charge storage gate is minimized.

7. The CMOS image sensor array of claim 1 wherein said charge storage region is approximately 500 Angstroms thick.

8. The CMOS image sensor array of claim 3 wherein said charge storage region is approximately 500 Angstroms thick.

9. The CMOS image sensor array of claim 1 wherein each pixel circuit further includes means for providing pixel to pixel isolation.

10. The CMOS image sensor array of claim 3 wherein each pixel circuit further includes means for providing pixel to pixel isolation.

11. The CMOS image sensor array of claim 1 further comprising color filters; light shielding layers, and micro-lenses deposited on a back surface of the image sensor array, which are capable of receiving, filtering, and shaping a pixel image signal projected on the back surface.

12. The CMOS image sensor array of claim 3 further comprising color filters; light shielding layers, and micro-lenses deposited on a back surface of the image sensor array, which are capable of receiving, filtering, and shaping a pixel image signal projected on the back surface.

13. A back side illuminated CMOS image sensor array having at least one pixel circuit, each pixel circuit comprising:
    a plurality of first transfer gates;
    a plurality of charge storage gates;
    a pinned photodiode for accumulating photon generated electron charge wherein said plurality of first transfer gates is coupled to said pinned photodiode and to a corresponding one of a plurality of charge storage gate regions under said plurality of charge storage gates, wherein said plurality of charge storage gates are located on top of said pinned photodiode and wherein said plurality of charge storage gates are biased such that said plurality of charge storage gate regions are formed, wherein said plurality of charge storage gate regions is capable of receiving and storing charge from said pinned photodiode via a corresponding one of said plurality of first transfer gates; and
    a plurality of output transfer gates coupled to a corresponding one of said plurality of charge storage gate regions for transferring charge stored under said plurality of charge storage gates to a plurality of charge detection means.

14. The CMOS image sensor of claim 13 wherein said charge storage gate regions comprise a silicon-silicon dioxide interface.

15. The CMOS image sensor array of claim 13 wherein said charge detection means includes a plurality of floating diffusion regions such that said plurality of output transfer gates coupled to said plurality of charge storage gate regions and to said plurality of floating diffusion regions can receive charge from said plurality of charge storage gate regions and transfer the charge onto said plurality of floating diffusion regions.

16. The CMOS image sensor array of claim 13 that is operated in a signal differencing mode to detect moving targets using sequential image sampling having the same integration times.

17. The CMOS image sensor pixel array of claim 13 that is operated in a high dynamic range mode utilizing sequential pixel signal sampling having different integration times.

18. The CMOS image sensor array of claim 16 wherein each pixel circuit further includes a source follower transistor having a gate connected to said floating diffusion region; a reset transistor connected to said floating diffusion region and a reset reference voltage; and an addressing transistor connected to said source follower transistor and array column bus lines whereby a signal from said source follower transistor is transferred to peripheral circuitry for further processing.

19. The CMOS image sensor array of claim 13 wherein said plurality of charge storage gate regions are approximately 500 Angstroms thick.

20. The CMOS image sensor array of claim 15 wherein said plurality of charge storage gate regions are approximately 500 Angstroms thick.

\* \* \* \* \*